United States Patent [19]
Hwang

[11] Patent Number: 5,700,700
[45] Date of Patent: Dec. 23, 1997

[54] TRANSISTOR IN A SEMICONDUCTOR DEVICE AND METHOD OF MAKING THE SAME

[75] Inventor: Joon Hwang, Manseung-Myun, Rep. of Korea

[73] Assignee: Hyundai Electronics Industries Co., Ltd., Kyungki-Do, Rep. of Korea

[21] Appl. No.: 665,513

[22] Filed: Jun. 18, 1996

[30] Foreign Application Priority Data

Jun. 20, 1995 [KR] Rep. of Korea ............ 95-16404

[51] Int. Cl.$^6$ .................................. H01L 21/265
[52] U.S. Cl. .................... 437/21; 437/41; 437/46
[58] Field of Search .................. 437/21, 44, 46, 437/40 TFT, 41 TFT

[56] References Cited

U.S. PATENT DOCUMENTS

| | | | |
|---|---|---|---|
| 4,805,546 | 2/1989 | Moniwa et al. | 437/41 |
| 5,198,379 | 3/1993 | Adan | 437/41 |
| 5,405,795 | 4/1995 | Beyer | 437/41 |
| 5,525,552 | 6/1996 | Huang | 437/41 |

FOREIGN PATENT DOCUMENTS 4-120736  4/1992  Japan .

*Primary Examiner*—John Niebling
*Assistant Examiner*—Brendan Mee
*Attorney, Agent, or Firm*—Fish & Richardson P.C.

[57] ABSTRACT

The present invention relates to a transistor in a semiconductor device and method of making thereof which can improve the driving speed, by forming the junction region thicker than the channel and LDD regions so as to reduce the resistance itself of the junction region.

5 Claims, 3 Drawing Sheets

TRANSISTOR IN A SEMICONDUCTOR DEVICE AND METHOD OF MAKING THE SAME

FIELD OF THE INVENTION

The present invention relates to a transistor in a semiconductor device and method of making the same, more particularly to a method of making a transistor in a semiconductor device, which can improve the driving speed by forming a polysilicon layer on a SOI (Silicon On Insulator) layer and then implanting an impurity ion therein so that a junction region is formed thicker than the channel and LDD regions.

BACKGROUND OF THE INVENTION

Generally, as the semiconductor device becomes highly integrated, a SOI transistor can be used as the next-generation transistor. The SOI transistor is a device the electrical characteristics of which, such as the punch-through characteristic and the threshold voltage, compared to a conventional MOS (Metal-Oxide-Semiconductor) transistor, are greatly improved. This SOI transistor is formed on a SOI wafer. The SOI wafer has a structure in which a SOI layer, such as an underlying silicon layer, an insulating layer and an upper silicon layer, are stacked differently from a conventionally used bulk-type wafer. The conventional method of making the transistor in the semiconductor device will be explained by reference to FIG. 1A and FIG. 1B.

As shown in FIG. 1A, a field oxide film 4 is formed at the field region of the SOI wafer 20 in which a silicon layer 1, an insulating layer 2 and a SOI layer 3 are formed in a stack structure. A gate oxide film 5 and a polysilicon layer 6 are sequentially formed on the resulting structure after forming the field oxide film 4. Thereafter, the gate oxide film 5 and the polysilicon film 6 are patterned to form a gate electrode 6A. A LDD (Lightly Doped Drain) region 7 is formed in the SOI layer 3 at both sides of the gate electrode 6A by implanting a low concentration of impurity ions. Thereafter, as shown in FIG. 1B, an oxide film spacer 8 is formed at both side walls of the gate electrode 6A and a junction region 9 is then formed in the exposed SOI layer 3 by implanting a high concentration of impurity ions. In the SOI transistor manufactured by the above process, the SOI layer 3 is formed thinly, at 500 through 1500 Å. Accordingly, resistance within the junction region 9 itself will increase since the depth of the junction region 9 is shallow. As a result, the driving speed of the transistor will decrease, resulting in degradation of the device characteristics.

SUMMARY OF THE INVENTION

Accordingly, the purpose of the present invention is to provide a transistor in a semiconductor device, and a method of making thereof, which can improve the above mentioned problem by forming a polysilicon layer on the upper portion of a junction region in a SOI (Silicon On Insulator) layer and then forming the junction region thicker than the channel and LDD regions by implantation of an impurity ion.

The transistor structure according to the present invention comprises: a field oxide layer formed on a field region of a SOI wafer in which a silicon layer, an insulating layer and a SOI layer is formed in stack structure; a gate oxide layer formed on a selected portion of an active region of the SOI wafer; a gate electrode formed on the gate oxide layer; an oxide spacer formed on both side walls of the gate electrode; and a polysilicon layer formed on the field oxide layer and the exposed portion of the SOI layer, wherein the polysilicon layer and the SOI layer under the polysilicon layer become a first junction region by the implanting of impurity ions, while the SOI layer under the oxide spacer becomes a second junction region by the implanting of impurity ions.

The method of making the transistor according to the present invention comprises the steps of: forming a field oxide layer on a field region of a SOI wafer in which a silicon layer, an insulating and a SOI layer are formed in stack structure; forming a first polysilicon layer on the resulting structure after forming the field oxide layer; patterning the first polysilicon layer so that a portion of the SOI layer is exposed; sequentially forming an oxide layer and a second polysilicon layer on the resulting structure after patterning the first polysilicon layer; forming a gate electrode by etching a selected portion of the second polysilicon layer and the oxide layer; forming a LDD region in the SOI layer; forming an oxide spacer on both side walls of the gate electrode; and implanting impurity ions in the first polysilicon layer and the SOI layer under the first polysilicon layer.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts through the several views of the drawings.

DESCRIPTION OF THE INVENTION

Below, the present invention will be described in detail by reference to the accompanying drawings.

FIG. 2A through FIG. 2E show sectional views of the devices for explaining a method of making a transistor in a semiconductor device according to the present invention.

Figure 1A:
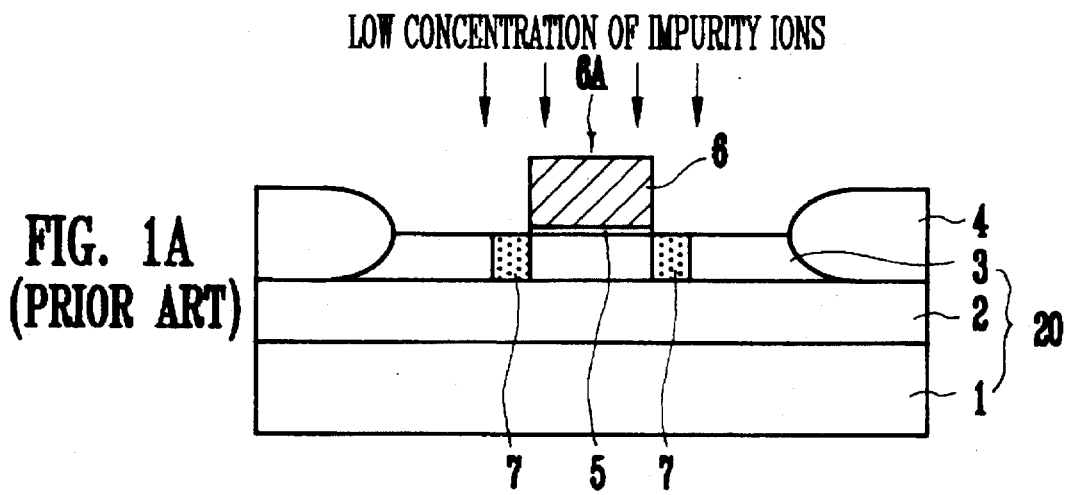
FIG. 1A and FIG. 1B show sectional views of the devices for explaining a conventional method of making a transistor in a semiconductor device.
Figure 1B:
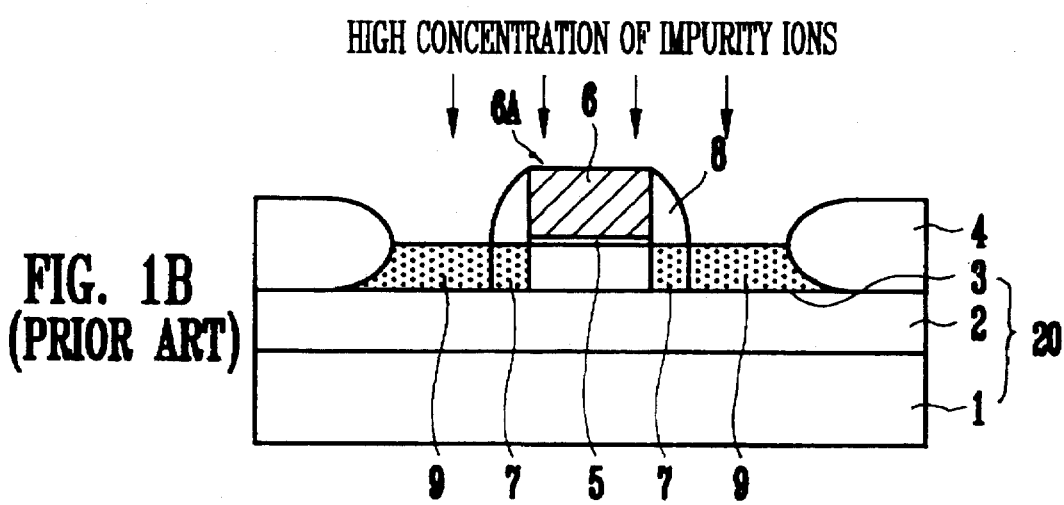
Figure 2A:
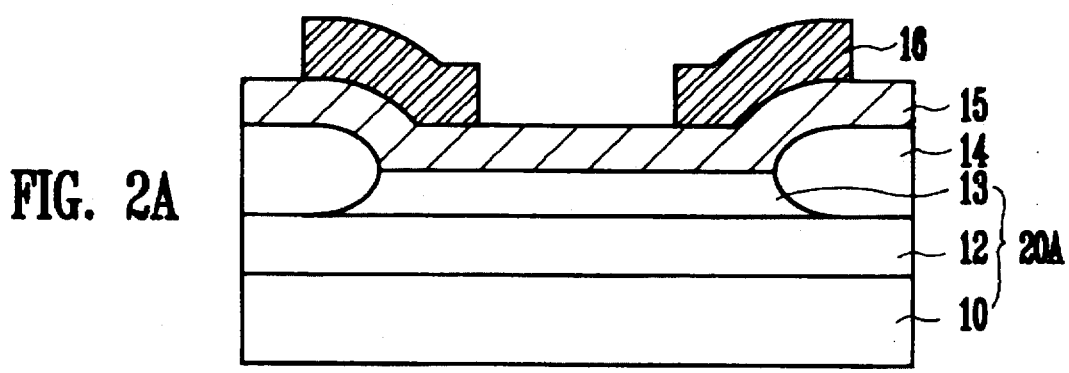
FIG. 2A through FIG. 2E show sectional views of the devices for explaining a method of making a transistor in a semiconductor device according to the present invention.

FIG. 2A shows a sectional view of the device in which, after a field oxide film 14 is formed at the field region of a SOI wafer 20A in which a silicon layer 10, an insulating layer 12 and a SOI layer 13 are formed in stack structure, a first polysilicon layer 15 and a first photoresist 16 are sequentially formed on its entire upper portions. One side portion of the first photoresist 16 remains intact at the portion where a junction region will be formed by patterning the first photoresist 16. The first polysilicon layer 15 is formed in thickness of 3000 through 4000 Å and the insulating layer 12 is formed with an oxide film.

Figure 2B:
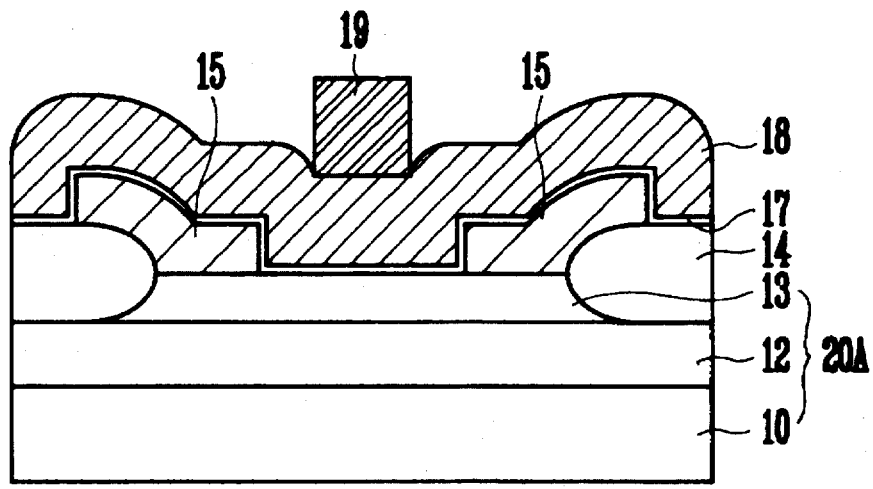

Referring to FIG. 2B, the first polysilicon layer 15 is etched using the first photoresist 16 as an etching mask. The first photoresist 16 is removed and a gate oxide layer 17, a second polysilicon layer 18 and a second photoresist 19 are sequentially formed on the resulting structure after removing the first photoresist 16. The second photoresist 19 is patterned using a mask for the gate electrode. Since the first polysilicon layer 15 connected to the SOI layer 13 is formed to cover a portion of the field oxide film 14, the area of the active region is increased.

Figure 2C:
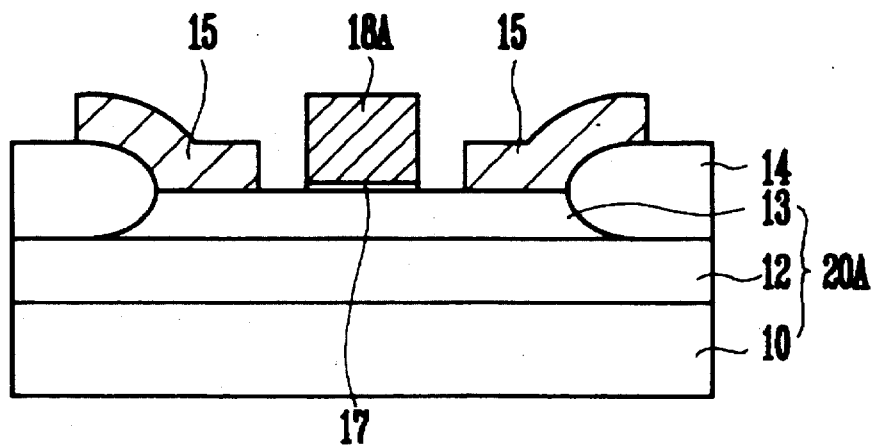

FIG. 2C shows a sectional view of the device in which after the second polysilicon layer 18 and the gate oxide film 17 are sequentially etched using the second patterned photoresist 19 as a mask, the second photoresist 19 is removed, thereby forming a gate electrode 18A.

Figure 2D:
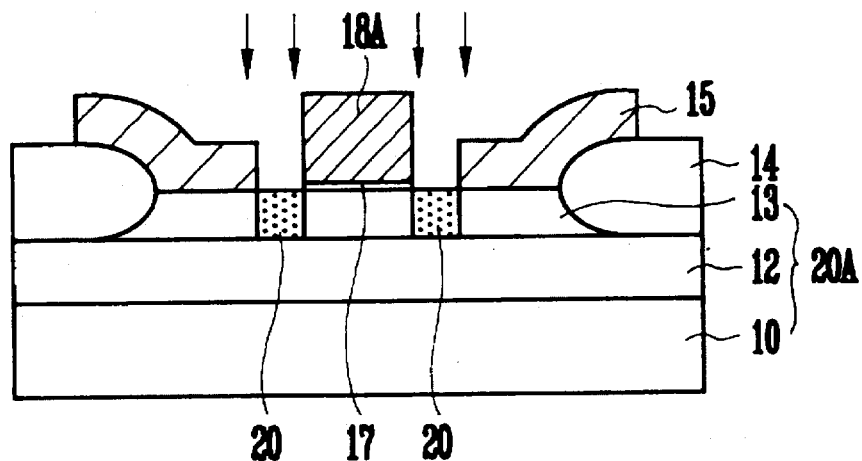

FIG. 2D shows a sectional view of the device in which, in the state of FIG. 2C, a LDD region 20 is formed in the SOI layer 13 by implanting a low concentration of impurity ions through the openings between the first polysilicon layer 15 and the gate electrode 18A.

Figure 2E:
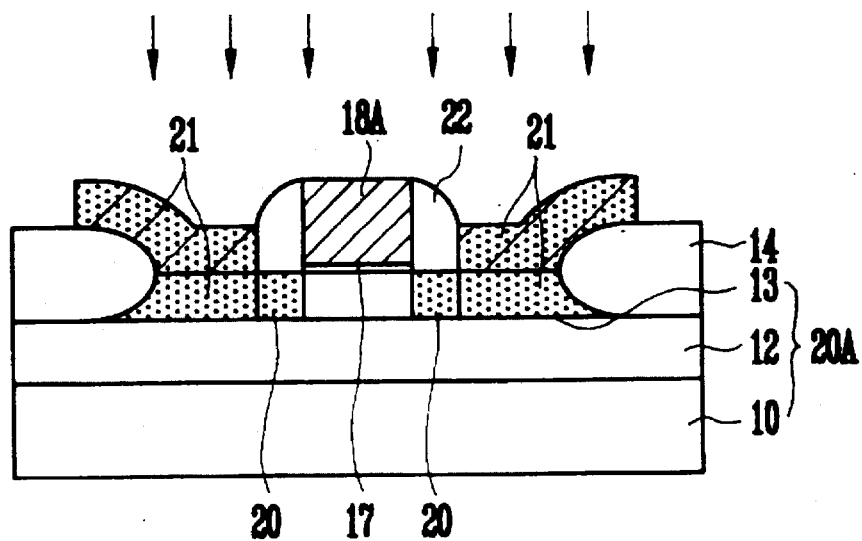

Referring to FIG. 2E, an oxide film is formed on the resulting structure after forming the LDD region 20. An oxide film spacer 22 is formed on both side walls of the gate electrode 18A and the upper portion of the LDD region 20 by blanket-etching the oxide film to expose the surface of the gate electrode 18A. A junction region 21 is then formed in the first polysilicon layer 15 and the SOI layer 13 under the first polysilicon layer 15 by implanting a high concentration of impurity ions.

The SOI transistor manufactured according to the above process can reduce the resistance of the junction region because the junction region comprises the SOI layer and the polysilicon layer.

According to the present invention, as described above, resistance of the junction region can be reduced by forming a polysilicon layer on a SOI layer and implanting an impurity ion so that the junction region is formed thicker than the channel and LDD regions and the depth of the junction region is increased. Also, the present invention has an outstanding effect that the driving speed of the transistor can improve by increasing the junction depth of the junction region and reducing the resistance itself of the junction region.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of making a transistor in a semiconductor device, comprising:

forming a field oxide layer on a field region of a silicon-on-insulator wafer having a silicon layer, an insulating layer and a silicon-on-insulator layer that are formed relative to one another in a stack structure;

forming a first polysilicon layer on a resulting structure after forming said field oxide layer;

patterning said first polysilicon layer so that said first polysilicon layer is on at least a portion of said silicon-on-insulator layer on and a portion of said silicon-on-insulator layer is exposed;

sequentially forming an oxide layer and a second polysilicon layer on a resulting structure after patterning said first polysilicon layer;

forming a gate electrode by etching a selected portion of said second polysilicon layer and said oxide layer;

forming a lightly-doped drain region in said silicon-on-insulator layer;

forming an oxide spacer on both side walls of said gate electrode; and implanting an impurity ion in said patterned first polysilicon layer and said silicon-on-insulator layer under said patterned first polysilicon layer.

2. The method of claim 1, wherein said insulating layer is formed of an oxide.

3. The method of claim 1, wherein said silicon-on-insulator layer is formed to a thickness of 500 through 1500 Å.

4. The method of claim 1, wherein said gate electrode is formed to a thickness of 3000 through 4000 Å.

5. The method of claim 1, wherein said first polysilicon layer is patterned to expose a portion of said silicon-on-insulator layer and a portion of said field oxide layer.

* * * * *